United States Patent
Chaudhry et al.

(10) Patent No.: US 7,913,201 B2
(45) Date of Patent: *Mar. 22, 2011

(54) STRUCTURE FOR ESTIMATING POWER CONSUMPTION OF INTEGRATED CIRCUITRY

(75) Inventors: Rajat Chaudhry, Austin, TX (US); Tilman Gloekler, Gaertringen (DE); Daniel L. Stasiak, Austin, TX (US); Todd Swanson, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 234 days.

This patent is subject to a terminal disclaimer.

(21) Appl. No.: 12/130,644

(22) Filed: May 30, 2008

(65) Prior Publication Data

US 2008/0288910 A1 Nov. 20, 2008

Related U.S. Application Data

(63) Continuation-in-part of application No. 11/530,100, filed on Sep. 8, 2006, now Pat. No. 7,720,667.

(51) Int. Cl.
*G06F 17/50* (2006.01)
(52) U.S. Cl. ............. 716/103; 716/116; 703/14; 703/18
(58) Field of Classification Search ............ 703/14, 703/18; 716/103, 116
See application file for complete search history.

(56) References Cited

U.S. PATENT DOCUMENTS

| | | | | |
|---|---|---|---|---|
| 5,625,803 A * | 4/1997 | McNelly et al. | ............... | 703/14 |
| 6,125,334 A * | 9/2000 | Hurd | ............... | 702/60 |
| 6,397,170 B1 | 5/2002 | Dean et al. | | |
| 6,598,209 B1 * | 7/2003 | Sokolov | ........... | 716/4 |
| 6,782,499 B2 | 8/2004 | Osada et al. | | |
| 6,810,482 B1 | 10/2004 | Saxena et al. | | |
| 7,093,143 B2 | 8/2006 | Ito et al. | | |
| 7,134,100 B2 * | 11/2006 | Ravi et al. | ........... | 716/2 |
| 7,141,883 B2 | 11/2006 | Wei et al. | | |
| 7,161,828 B2 | 1/2007 | Cummings et al. | | |
| 2004/0019859 A1 | 1/2004 | Ravi et al. | | |
| 2004/0236559 A1 * | 11/2004 | Chen | ............. | 703/18 |
| 2005/0050494 A1 * | 3/2005 | McGuffin et al. | ........... | 716/5 |
| 2005/0204316 A1 * | 9/2005 | Nebel et al. | ........... | 716/2 |
| 2005/0278664 A1 | 12/2005 | Chaudhry et al. | | |
| 2006/0071691 A1 | 4/2006 | Garlepp | | |

* cited by examiner

*Primary Examiner* — Naum B Levin
(74) *Attorney, Agent, or Firm* — Matthew B. Talpis; James L. Baudino

(57) ABSTRACT

A design structure is embodied in a machine readable medium for designing, manufacturing, or testing integrated circuitry. The design structure includes first hardware for executing first software in response to macros that describe the integrated circuitry, and for generating a set of constants in response to the execution of the first software. Second hardware is for receiving the set of constants from the first hardware, and for executing second software in response to the macros and the set of constants, and for estimating a power consumption of the integrated circuitry in response to the execution of the second software.

32 Claims, 8 Drawing Sheets

STRUCTURE FOR ESTIMATING POWER CONSUMPTION OF INTEGRATED CIRCUITRY

CROSS-REFERENCE TO RELATED APPLICATION

This application claims priority to and is a continuation-in-part of co-owned co-pending U.S. patent application Ser. No. 11/530,100, filed Sep. 8, 2006, by Chaudhry et al., entitled METHOD AND SYSTEM FOR ESTIMATING POWER CONSUMPTION OF INTEGRATED CIRCUITRY, which is incorporated herein by reference in its entirety.

TECHNICAL FIELD

The disclosures herein relate in general to a design structure, and in particular to a design structure for estimating power consumption of integrated circuitry.

BACKGROUND

In very large scale integration ("VLSI") designs of integrated circuitry, power consumption is a significant factor. For example, power consumption has a direct impact on battery life, heat dissipation, packaging requirements, and other design criteria for systems that include such integrated circuitry. Generally, a lower power consumption is desirable. Accordingly, previous techniques have been developed for modeling designs of integrated circuitry, including previous techniques for estimating power consumption of such integrated circuitry.

Nevertheless, a need has arisen for a design structure for estimating power consumption of integrated circuitry, in which various shortcomings of previous techniques are overcome. For example, a need has arisen for a design structure for estimating power consumption of integrated circuitry, in which power consumption is estimated with higher efficiency and accuracy.

SUMMARY

A design structure is embodied in a machine readable medium for designing, manufacturing, or testing integrated circuitry. The design structure includes first hardware for executing first software in response to macros that describe the integrated circuitry, and for generating a set of constants in response to the execution of the first software. Second hardware is for receiving the set of constants from the first hardware, and for executing second software in response to the macros and the set of constants, and for estimating a power consumption of the integrated circuitry in response to the execution of the second software.

A principal advantage of this embodiment is that various shortcomings of previous techniques are overcome. For example, a principal advantage of this embodiment is that power consumption is estimated with higher efficiency and accuracy.

DETAILED DESCRIPTION

Figure 1:
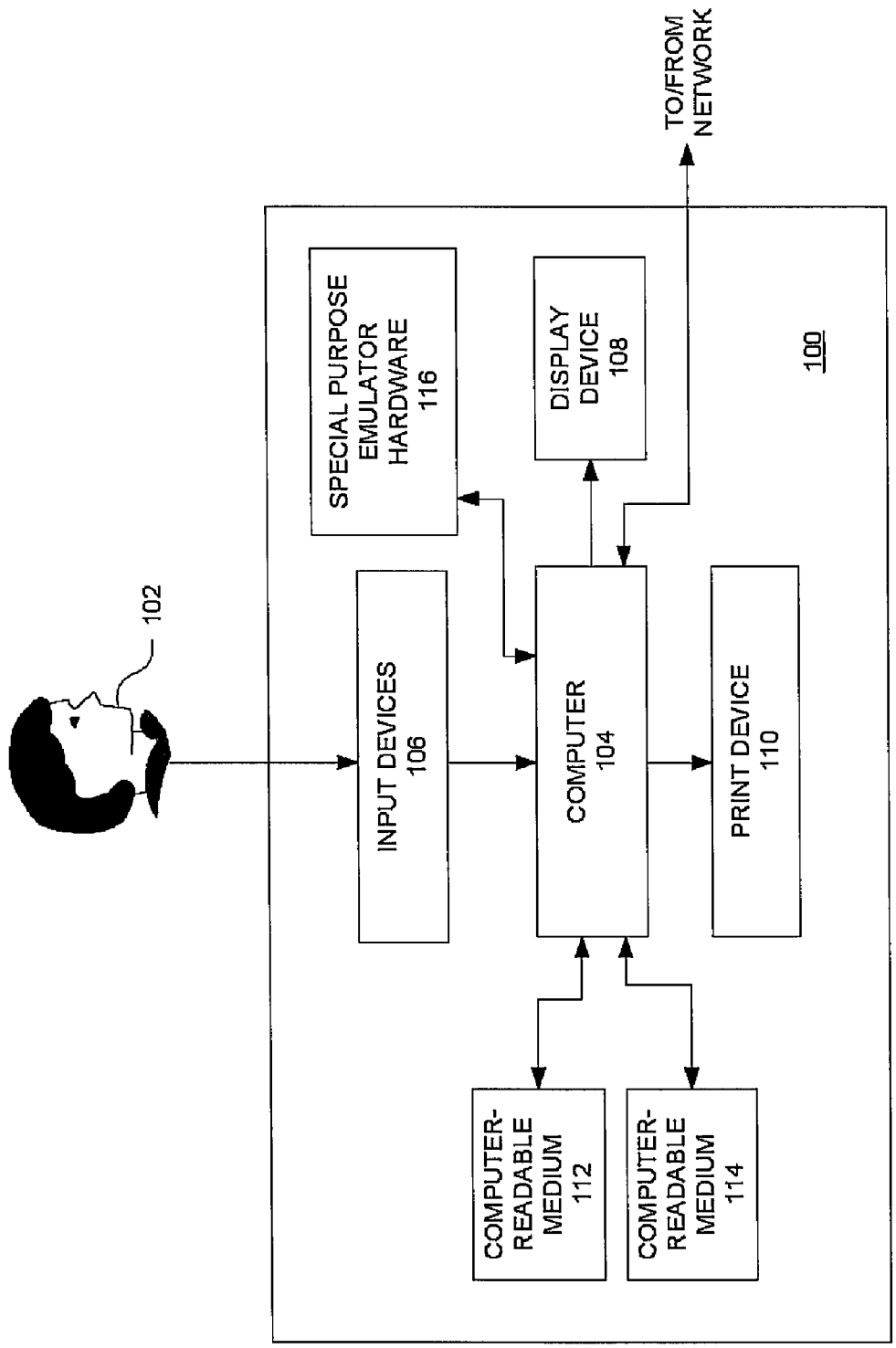
FIG. 1 is a block diagram of a representative computing system, according to the illustrative embodiment.

FIG. 1 is a block diagram of a representative information handling system ("IHS") 100, according to the illustrative embodiment. In the example of FIG. 1, the IHS 100 operates in association with a human user 102. The IHS 100 is formed by various electronic circuitry components, including: (a) a general purpose computer 104, such as a workstation or server, for executing and otherwise processing instructions, and for performing additional operations (e.g., communicating information) in response thereto, as discussed further hereinbelow; (b) input devices 106 for receiving information from the user 102; (c) a display device 108 (e.g., a conventional flat panel monitor) for displaying information to the user 102; (d) a print device 110 (e.g., a conventional electronic printer or plotter) for printing visual images on paper; (e) a computer-readable medium (or apparatus) 112 (e.g., a hard disk drive or other nonvolatile storage device) for storing information; (f) a portable computer-readable medium (or apparatus) 114 (e.g., a removable flash memory card or CD-ROM) for storing information; (g) special purpose emulator hardware 116 for simulating operations of integrated circuitry, as discussed further hereinbelow in connection with FIGS. 2-7; and (h) various other electronic circuitry for performing other operations of the IHS 100.

For example, the computer 104 includes: (a) a network interface (e.g., circuitry) for communicating between the computer 104 and a network (e.g., outputting information to, and receiving information from, the network), such as by transferring information (e.g. instructions, data, signals) between the computer 104 and the network; and (b) a memory device (e.g., random access memory ("RAM") device and/or read only memory ("ROM") device) for storing information (e.g., instructions of software executed by the computer 104, and data processed by the computer 104 in response to such instructions). Accordingly, in the example of FIG. 1, the computer 104 is connected to a network, the input devices 106, the display device 108, the print device 110, the computer-readable medium 112, and the computer-readable medium 114, as shown in FIG. 1.

In response to signals from the computer 104, the display device 108 displays visual images, which represent information, and the user 102 views such visual images. Moreover, the user 102 operates the input devices 106 to output information to the computer 104, and the computer 104 receives such information from the input devices 106. Also, in response to signals from the computer 104, the print device 110 prints visual images on paper, and the user 102 views such visual images.

The input devices 106 include, for example, a conventional electronic keyboard (or keypad) and a pointing device, such as a conventional electronic "mouse," rollerball or light pen. The user 102 operates the keyboard (or keypad) to output alphanumeric text information to the computer 104, which receives such alphanumeric text information. The user 102 operates the pointing device to output cursor-control information to the computer 104, and the computer 104 receives such cursor-control information. The input devices 106 also include, for example, touch-sensitive circuitry of a liquid crystal display ("LCD") device.

Figure 2:
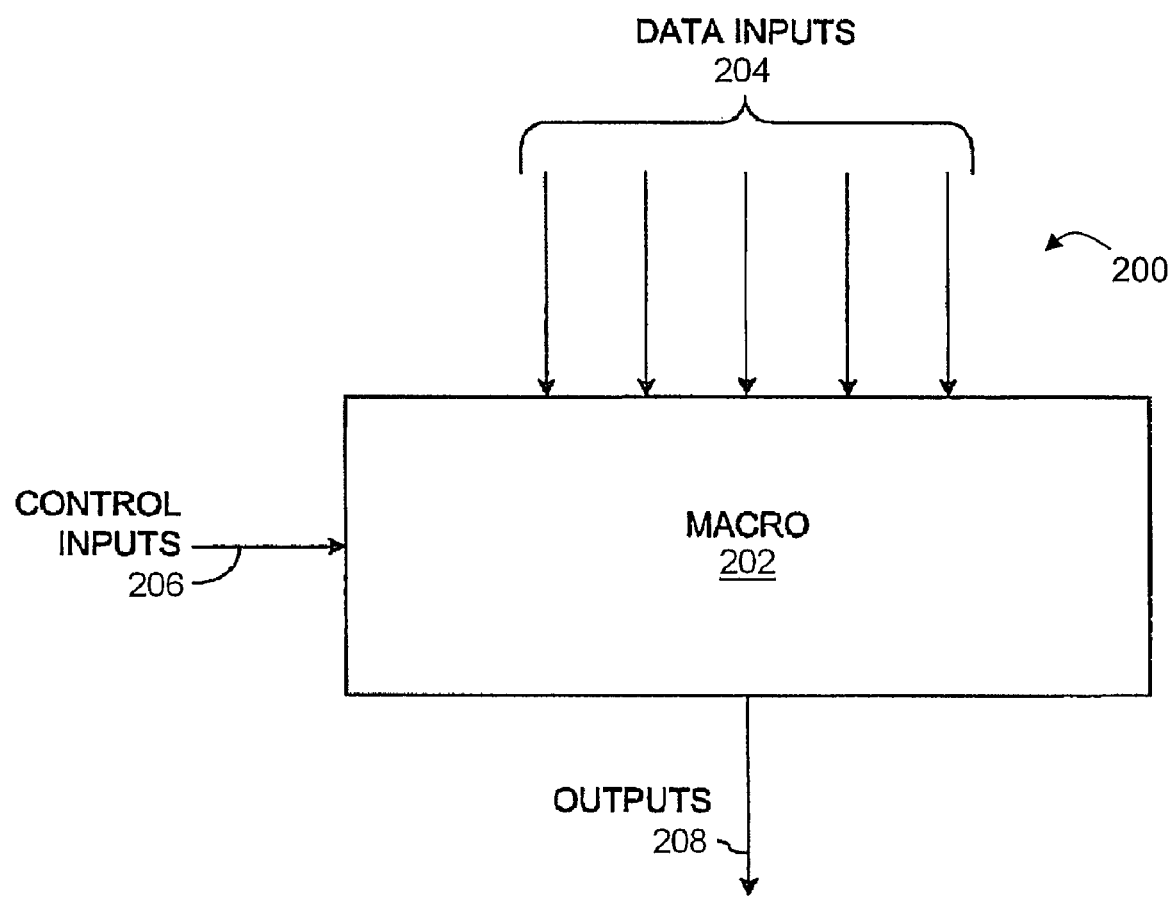
FIG. 2 is a block diagram of a macro model, according to the illustrative embodiment.

FIG. 2 is a block diagram of a macro model, indicated generally at 200, according to the illustrative embodiment. As shown in FIG. 2, the macro model 200 includes a macro 202, multiple data inputs 204, multiple control inputs 206, and multiple outputs 208. The data inputs 204, the control inputs 206, and the outputs 208 are multiple ports, to which the macro 202 is figuratively connected. The macro 202 is a register-transfer level description ("RTL") of integrated circuitry, such as a VERILOG description or VHDL description of integrated circuitry.

In the illustrative embodiment, the macro 202 is RTL of a relatively small portion (e.g., an integrated circuitry latch) of larger integrated circuitry (e.g., a microprocessor). Accordingly, the macro 202 is a representative example of numerous macros, which together form RTL of the larger integrated circuitry. Accordingly, the macro 202 is figuratively connected to one or more of the numerous macros, through the data inputs 204, the control inputs 206, and the outputs 208. The IHS 100 executes software for simulating operations (which are described by the numerous macros) of the integrated circuitry, in response to the numerous macros.

For the integrated circuitry that is described by the example macro 202, a switching factor (per clock cycle of the integrated circuitry's operation) is a percentage of signals (e.g., as simulated from the data inputs 204 and from the control inputs 206) that toggle after an immediately preceding clock cycle of the integrated circuitry's operation. For example, if one-half of the signals toggle, then the switching factor is fifty percent (50%). Generally, if switching factor increases, then power consumption increases.

Moreover, if clock activity increases, then power consumption increases. For example, if all clock drivers in the integrated circuitry are active during a clock cycle of the integrated circuitry's operation, then clock activity is 100% during such clock cycle. By comparison, if no clock drivers in the integrated circuitry are active during a clock cycle of the integrated circuitry's operation, then clock activity is 0% during such clock cycle. Similarly, if m of N clock drivers in the integrated circuitry are active during a clock cycle of the integrated circuitry's operation, then clock activity is (m/N 100)% during such clock cycle, where N is a total number (e.g., a total weighted number) of clock drivers in the integrated circuitry. Accordingly, clock activity (per clock cycle of the integrated circuitry's operation) is a measure of capacitive load that is driven in the integrated circuitry during such clock cycle.

Figure 3:
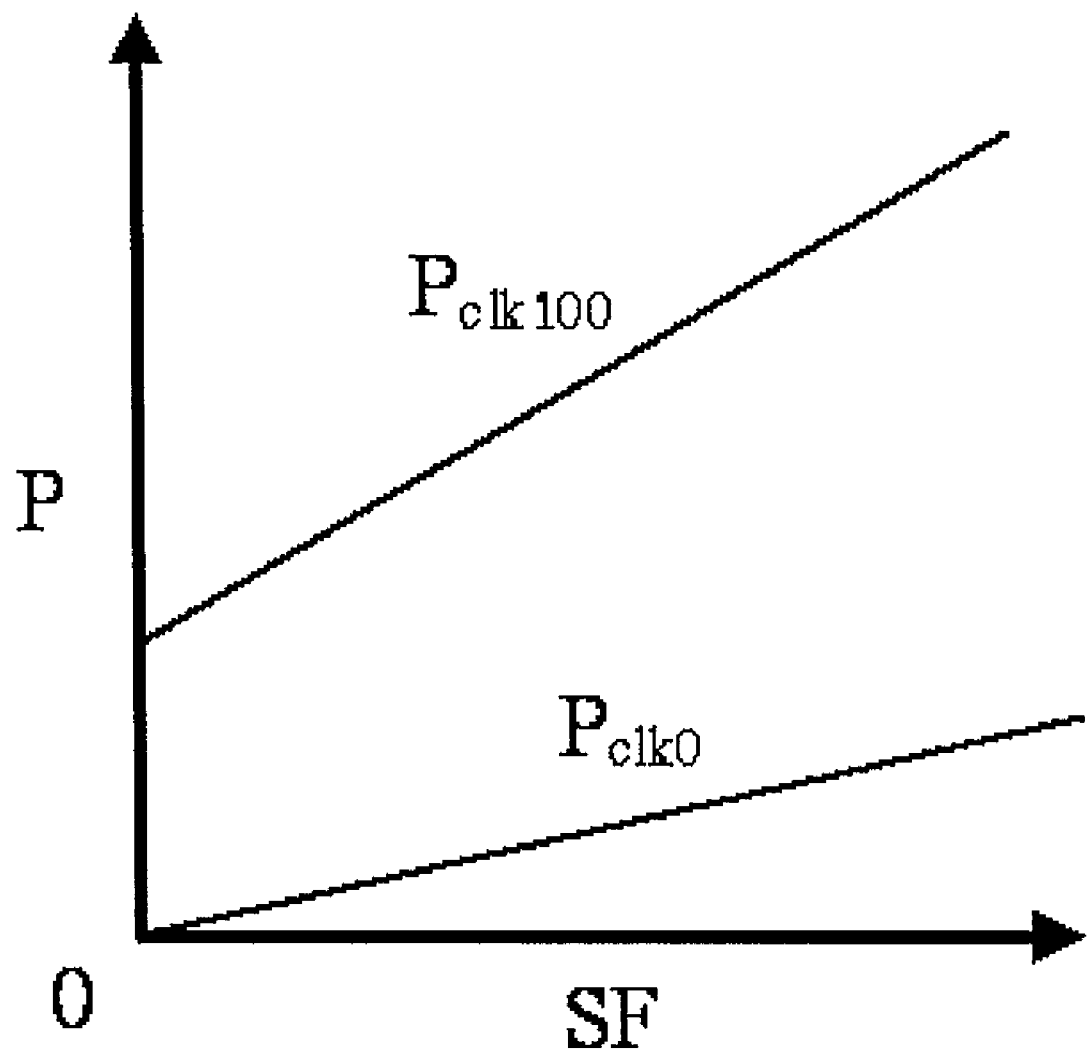
FIG. 3 is an illustrative graph of power as a function of switching factor.

FIG. 3 is an illustrative graph of power consumption P as a function of switching factor SF for the example macro 202. As shown in FIG. 3: (a) a $P_{clk0}$ line represents power P as a function of switching factor SF, in a situation where clock activity CLK=0%; and (b) a $P_{clk100}$ line represents power P as a function of switching factor SF, in a situation where clock activity CLK=100%.

Per macro (and, accordingly, for the integrated circuitry that is described by such macro), general purpose processor ("GPP") hardware of the computer 104 generates a respective energy model. In such generation, the computer 104 executes first software (e.g., simulation program with integrated circuit emphasis, a/k/a "SPICE") for estimating a power consumption P (of the integrated circuitry that is described by such macro) at various representative combinations of switching factor SF and clock activity CLK (e.g., at representative switching factors of 0%, 50% and 100%, and at representative clock activities of 0% and 100%), in multiple clock cycles of the integrated circuitry's simulated operation. Such estimates (at the representative combinations of switching factor SF and clock activity CLK) together form such macro's respective sample energy information. In one embodiment, the computer 104 selects the representative combinations of switching factor SF and clock activity CLK in response to estimates by the computer 104 of the integrated circuitry's average switching factor, average clock activity, and average power consumption.

For example, the computer 104 executes the first software for estimating such power consumption P(C): (a) at SF=0% and CLK=0%, in a first clock cycle C=1 of the integrated circuitry's simulated operation; (b) at SF=0% and CLK=100%, in a second clock cycle C=2 of the integrated circuitry's simulated operation; (c) at SF=50% and CLK=0%, in a third clock cycle C=3 of the integrated circuitry's simulated operation; (d) at SF=50% and CLK=100%, in a fourth clock cycle C=4 of the integrated circuitry's simulated operation; (e) at SF=100% and CLK=0%, in a fifth clock cycle C=5 of the integrated circuitry's simulated operation; and (f) at SF=100% and CLK=100%, in a sixth clock cycle C=6 of the integrated circuitry's simulated operation.

Subsequently, the special purpose emulator hardware 116 (e.g., a hardware acceleration emulator board) executes second software for estimating the power consumption (of the integrated circuitry that is described by such macro) at other combinations of switching factor and clock activity (e.g., other than the representative combinations of switching factor and clock activity), by interpolation and/or extrapolation in response to such macro's respective sample energy information (e.g., according to a variety of linear and/or non-linear interpolation and/or extrapolation techniques, such a least square fitting and splines). Such macro's respective sample energy information, along with such interpolation and/or extrapolation techniques for such macro, together form such macro's respective energy model. Relative to execution of the first software, such execution of the second software is less complex, less time-consuming and less computationally intensive.

Even if the integrated circuitry's design is adjusted (e.g., by a human designer and/or by the IHS 100 executing automated design software), the example macro 202 is likewise adjustable, so that the example macro 202 continues to describe the integrated circuitry's adjusted design. In that manner, the special purpose emulator hardware 116 estimates the power consumption (of the integrated circuitry that is described by such macro) with more accuracy under a variety of conditions (e.g., adjusted designs of the integrated circuitry), so that: (a) the estimated power consumption under such variety of conditions is subject to comparison with more accuracy; and (b) in response to such comparison, one or more of such conditions are selectable (e.g., by a human designer and/or by the IHS 100 executing automated design software) to achieve a reduction of such power consumption, earlier in the integrated circuitry's development, thereby increasing a level of efficiency and accuracy in such development (e.g., fewer iterations, and shorter development time).

Per macro (and, accordingly, for the integrated circuitry that is described by such macro), the special purpose emulator hardware 116 executes the second software for estimating power consumption P(C) as a linear function of switching factor SF and clock activity CLK, where P(C) is power consumption (of the integrated circuitry that is described by such macro) in a clock cycle C of the integrated circuitry's simulated operation, such that $P(C)=P_{clk0}(SF)+(P_{clk100}(SF)-P_{clk0}(SF))\cdot CLK$, where:

(a) $P_{clk0}(SF)$ is the estimated power consumption at switching factor SF when clock activity CLK=0%; and (b) $P_{clk100}(SF)$ is the estimated power consumption at switching factor SF when clock activity CLK=100%.

In the illustrative embodiment, the special purpose emulator hardware 116 executes the second software for estimating $P_{clk0}(SF)$ and $P_{clk100}(SF)$ by linear interpolation and/or linear extrapolation of such macro's respective sample energy information (which was previously estimated by the computer 104 executing the first software, as discussed further hereinabove). In an alternative embodiment, the special purpose emulator hardware 116 executes the second software for estimating $P_{clk0}(SF)$ and $P_{clk100}(SF)$ by non-linear interpolation and/or non-linear extrapolation techniques, in response to such macro's respective sample energy information.

$P_{clk0max}=P_{clk0}(100)=P_{clk0}(SF)$ at SF=1.0 (which is a decimal representation of 100%).

$P_{clk100min}=P_{clk100}(0)=P_{clk100}(SF)$ at SF=0.0 (which is a decimal representation of 0%).

$P_{clk100max}=P_{clk100}(100)=P_{clk100}(SF)$ at SF=1.0.

If $P_{clk0}(SF)$ is a linear function of switching factor SF, then $P_{clk0}(SF)=P_{clk0max}\cdot SF$, where SF is a decimal representation of the switching factor in a clock cycle of the integrated circuitry's simulated operation.

Similarly, if $P_{clk100}(SF)$ is a linear function of switching factor SF, then $P_{clk100}(SF)=P_{clk100min}+P_{clk100max}\cdot SF$, where SF is a decimal representation of the switching factor in a clock cycle of the integrated circuitry's simulated operation.

By substitution, $P(C)=P_{clk0}(SF)+(P_{clk100}(SF)-P_{clk0}(SF))\cdot CLK$ is rewritten as $P(C)=P_{clk0max}\cdot SF+(P_{clk100min}+P_{clk100max}\cdot SF-P_{clk0max}\cdot SF)\cdot CLK$, which is rearranged as:

$P(C)=P_{clk0max}\cdot SF+CLK\cdot(P_{clk100min}+(P_{clk100max}-P_{clk0max})\cdot SF)$.

For the integrated circuitry that is described by the example macro 202: (a) a value NUMSF (per clock cycle of the integrated circuitry's operation) is a number of signals (e.g., as simulated from the data inputs 204 and from the control inputs 206) that toggle after an immediately preceding clock cycle of the integrated circuitry's operation; and (b) a value TOTSF is a total number of all signals from the data inputs 204 and from the control inputs 206, irrespective of whether such signals toggle after an immediately preceding clock cycle of the integrated circuitry's operation. Accordingly, SF=NUMSF/TOTSF.

Similarly, for the integrated circuitry that is described by the example macro 202: (a) a value NUMCLK (per clock cycle of the integrated circuitry's operation) is a number (e.g., a total weighted number) of clock drivers in the integrated circuitry that are active during such clock cycle; and (b) a value TOTCLK is a total number (e.g., a total weighted number) of all clock drivers in the integrated circuitry, irrespective of whether such clock drivers are active during such clock cycle. Accordingly, CLK=NUMCLK/TOTCLK.

In one embodiment, such numbers of signals from the data inputs 204 and from the control inputs 206 are weighted, so that the special purpose emulator hardware 116 selectively attributes different weights to one or more of such signals, in order to more accurately model the respective effects of such signals on the values of NUMSF and TOTSF. Similarly, in one embodiment, such numbers of clock drivers in the integrated circuitry are weighted, so that the special purpose emulator hardware 116 selectively attributes different weights to one or more of such clock drivers, in order to more accurately model the respective effects of such clock drivers on the values of NUMCLK and TOTCLK.

By substitution, $P(C)=P_{clk0max}\cdot SF+CLK\cdot(P_{clk100min}+(P_{clk100max}-P_{clk0max})\cdot SF)$ is rewritten as:

$P(C)=P_{clk0max}\cdot(NUMSF/TOTSF)+(NUMCLK/TOTCLK)\cdot(P_{clk100min}+[(P_{clk100max}-P_{clk0max})\cdot(NUMSF/TOTSF)])$.

In such estimation of P(C) for the integrated circuitry that is described per macro (e.g., macro 202): (a) the variables (per clock cycle of the integrated circuitry's simulated operation) are NUMSF and NUMCLK; and (b) the other values are constant per macro. Accordingly, the following values are constant per macro:

ConstA=$(P_{clk0max}/TOTSF)$;
ConstB=$(P_{clk100max}-P_{clk0max})/(TOTCLK\cdot TOTSF)$; and
ConstC=$(P_{clk100min}/TOTCLK)$.

By substitution, $P(C)=P_{clk0max}\cdot(NUMSF/TOTSF)+(NUMCLK/TOTCLK)\cdot(P_{clk100min}+[(P_{clk100max}-P_{clk0max})\cdot(NUMSF/TOTSF)])$ is rewritten as:

$P(C)=ConstA\cdot NUMSF+NUMCLK\cdot(ConstB\cdot NUMSF+ConstC)$.

Accordingly, per macro (e.g., macro 202), the IHS 100 generates (e.g., precalculates) such macro's respective ConstA, ConstB and ConstC, with GPP hardware of the computer 104, which outputs such macro's respective ConstA, ConstB and ConstC to the special purpose emulator hardware 116. The special purpose emulator hardware 116 is a special purpose computational resource that is coupled to the computer 104, as discussed further hereinbelow in connection with FIGS. 4-7. From the computer 104, the special purpose emulator hardware 116 receives and stores such macro's respective ConstA, ConstB and ConstC.

Per macro, and per clock cycle C of the integrated circuitry's simulated operation, the special purpose emulator hardware 116 (in response to its execution of the second software): (a) simulates such operation of the integrated circuitry as described by such macro and, in response thereto, generates NUMSF and NUMCLK of such clock cycle C for such macro; and (b) calculates P(C) in response to (i) such macro's respective ConstA, ConstB and ConstC, and (ii) such clock cycle C's NUMSF and NUMCLK for such macro. The special purpose emulator hardware 116 performs such calculation according to $P(C)=ConstA\cdot NUMSF+NUMCLK\cdot(ConstB\cdot NUMSF+ConstC)$. Accordingly, the special purpose emulator hardware 116 performs such calculation without division, so that the special purpose emulator hardware 116 performs such calculation at higher speed with fixed point adders and multipliers.

Moreover, the special purpose emulator hardware 116 performs such operations and calculation: (a) with increased speed, relative to an alternative in which such operations and calculation are performed by execution of higher-level software (e.g., higher-level RTL simulator software) with a general purpose computational resource (e.g., the GPP hardware of the computer 104); and (b) without sacrificing accuracy, relative to such alternative. Accordingly, with the special purpose emulator hardware 116, the IHS 100 performs such operations and calculation, while allocating a smaller amount of general purpose computational resource for such performance. With the increased speed, the IHS 100 estimates power consumption with more efficiency for: (a) computationally intensive simulations of realistic workloads (e.g., simulations of booting an operating system, and simulations of multi-chip system-level applications); and (b) formal verification of the numerous macros for which power consumption is estimated (e.g., formal verification to solve formal proofs of estimated power consumption thresholds, such as peak estimated power consumption or change in estimated power consumption).

In the illustrative embodiment, the macro 202 is RTL of a relatively small portion (e.g., an integrated circuitry latch) of larger integrated circuitry (e.g., a microprocessor). Accordingly, the macro 202 is a representative example of numerous macros, which together form RTL of the larger integrated circuitry. Also, in the illustrative embodiment, the operations (e.g., generation of NUMSF and NUMCLK, and calculation of P(C) in response thereto) and interconnection structures of the second software (which is executed by the special purpose emulator hardware 116) are described by a hardware description language ("HDL"), such as RTL, which is: (a) combined (e.g., linked and/or integrated) together with the numerous macros; and (b) executed by the special purpose emulator hardware 116 to perform (i) such operations and (ii) the operations of the numerous macros. In that manner, operations of the second software are more readily enhanced to include additional functions, such as: (a) thermal hot-spot detection of specific macros whose estimated power consumption is especially high; (b) calculation of peak estimated power consumption for specified partitions of the numerous macros and/or for all of the numerous macros aggregately; and (c) calculation of average estimated power consumption for specified partitions of the numerous macros and/or for all of the numerous macros aggregately.

Figure 4:
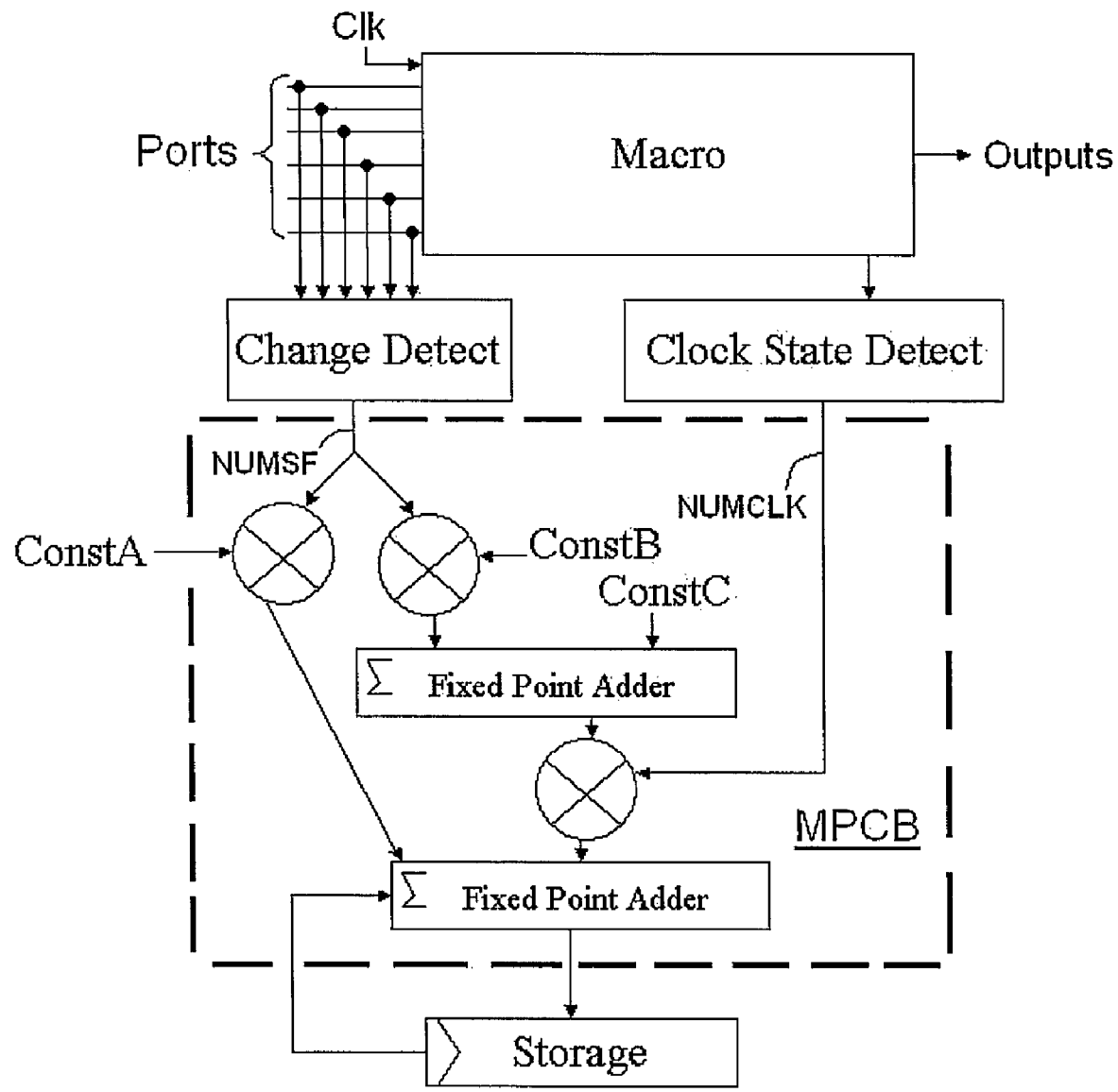
FIG. 4 is a block diagram of a representative macro power calculator block of special purpose emulator hardware of the representative computing system, according to the illustrative embodiment.

FIG. 4 is a block diagram of a representative macro power calculator block ("MPCB") of the special purpose emulator hardware 116, according to the illustrative embodiment. In the example of FIG. 4, the MPCB is dedicated to a single macro (e.g., macro 202), which is figuratively connected to: (a) a clock input Clk; (b) multiple ports (e.g., the data inputs 204 and the control inputs 206); and (c) outputs (e.g., the outputs 208).

As shown by a Storage element in FIG. 4, the special purpose emulator hardware 116 stores a total estimated power consumption for the macro (and, accordingly, for the integrated circuitry that is described by such macro), aggregately for all clock cycles of the integrated circuitry's simulated operation. After completing a number of clock cycles of the integrated circuitry's simulated operation, the special purpose emulator hardware 116 calculates an average (per clock cycle) estimated power consumption for the macro (and, accordingly, for the integrated circuitry that is described by such macro), by dividing such total estimated power consumption by such number of clock cycles. Before the first clock cycle of the integrated circuitry's simulated operation, the special purpose emulator hardware 116 initializes the Storage element's stored total estimated power consumption for the macro, so that such stored total estimated power consumption has an initial value of zero.

Per clock cycle C (as indicated by logic states of the clock input Clk) of the integrated circuitry's simulated operation, the special purpose emulator hardware 116 (in response to its execution of the second software):

(a) simulates operations of the integrated circuitry as described by the macro, in response to then-current logic states of the multiple ports (e.g., then-current logic states of the data inputs 204 and the control inputs 206);

(b) in response thereto, modifies then-current logic states of the outputs (e.g., then-current logic states of the outputs 208);

(c) with Change Detect logic, generates NUMSF, in response to: (i) then-current logic states of the multiple ports; and (ii) the logic states of such ports in a previous clock cycle C-1 of the integrated circuitry's simulated operation;

(d) with Clock State Detect logic, generates NUMCLK, in response to a number of clock drivers (in the simulated operation of the integrated circuitry as described by the macro) that are active during clock cycle C;

(e) with the MPCB, calculates P(C)=ConstA•NUMSF+NUMCLK. (ConstB•NUMSF+ConstC) by: (i) as shown by a first fixed point multiplier in FIG. 4, multiplying ConstA and NUMSF; (ii) as shown by a second fixed point multiplier in FIG. 4, multiplying ConstB and NUMSF; (iii) as shown by a first fixed point adder in FIG. 4, adding ConstC to the second fixed point multiplier's resulting product of ConstB•NUMSF; (iv) as shown by a third fixed point multiplier in FIG. 4, multiplying NUMCLK and the first fixed point adder's resulting sum of (ConstB•NUMSF+ConstC); and (v) as shown by a second fixed point adder in FIG. 4, adding the first fixed point multiplier's resulting product of ConstA•NUMSF and the third fixed point multiplier's resulting product of NUMCLK•(ConstB•NUMSF+ConstC) and the Storage element's stored total estimated power consumption for the macro; and (f) as shown by the Storage element in FIG. 4, stores the second fixed point adder's resulting sum, as an updated value of the Storage element's stored total estimated power consumption for the macro, so that (in a next clock cycle C+1 of the integrated circuitry's simulated operation) such updated value is the then-current total estimated power consumption for the macro, aggregately for all clock cycles of the integrated circuitry's simulated operation.

In a next clock cycle C+1 of the integrated circuitry's simulated operation, then-current logic states of the outputs (e.g., then-current logic states of the outputs 208) serve as then-current logic states of other ports to one or more of the other numerous macros. The Change Detect logic, Clock State Detect logic, MPCB and Storage element operate in response to logic states of the clock input Clk, although for clarity FIG. 4 does not show all such connections to the clock input Clk.

Figure 5:
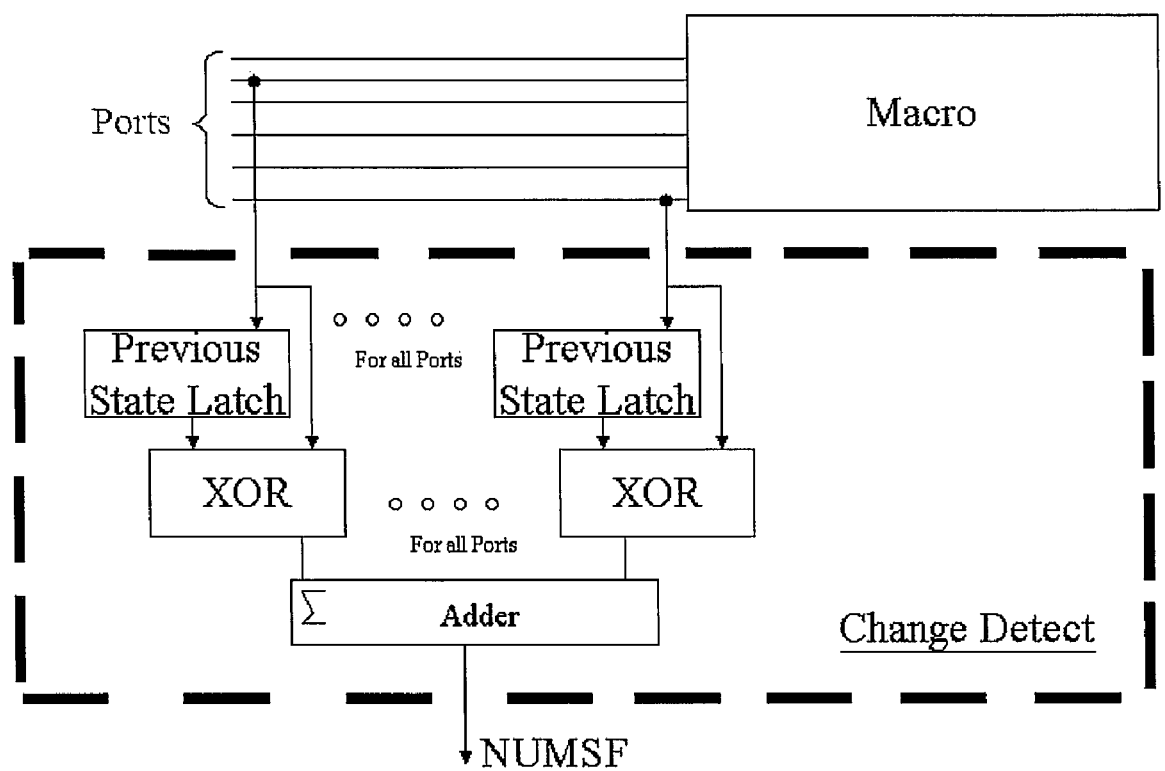
FIG. 5 is a block diagram of change detect logic of the representative macro power calculator block of FIG. 3.

FIG. 5 is a block diagram of the Change Detect logic of FIG. 4. The Change Detect logic is customizable for each macro. With the Change Detect logic, the special purpose emulator hardware 116 generates NUMSF, in response to: (a) then-current logic states of the multiple ports; and (b) the logic states of such ports in a previous clock cycle C-1 of the integrated circuitry's simulated operation, as stored by Previous State Latches (one 1-bit Previous State Latch per port). As shown in FIG. 5, per clock cycle C (as indicated by logic states of the clock input Clk) of the integrated circuitry's simulated operation, the special purpose emulator hardware 116 (in response to its execution of the second software):

(a) per port, performs a respective exclusive-OR ("XOR") operation, in response to: (i) such port's then-current logic state; and (ii) such port's logic state in a previous clock cycle C-1 of the integrated circuitry's simulated operation, as stored by such port's respective Previous State Latch;

(b) as shown by such port's respective Previous State Latch in FIG. 5, stores such port's then-current logic state, so that such logic state is available for such XOR operation in a next clock cycle C+1 of the integrated circuitry's simulated operation; and (c) as shown by a fixed point adder in FIG. 5, adds the results of such XOR operations for all of the multiple ports.

In such clock cycle C, the fixed point adder's resulting sum is NUMSF for the macro, as shown in FIG. 5. For example, if a port's then-current logic state=0 in such clock cycle C, and if such port's logic state=0 in the previous clock cycle C-1 as stored by such port's respective Previous State Latch, then the result of such XOR operation for such port is 0. Similarly, if a port's then-current logic state=1 in such clock cycle C, and if such port's logic state=1 in the previous clock cycle C-1 as stored by such port's respective Previous State Latch, then the result of such XOR operation for such port is 0. Or, if a port's then-current logic state in such clock cycle C is different from such port's logic state in the previous clock cycle C-1 as stored by such port's respective Previous State Latch, then the result of such XOR operation for such port is 1.

Figure 6:
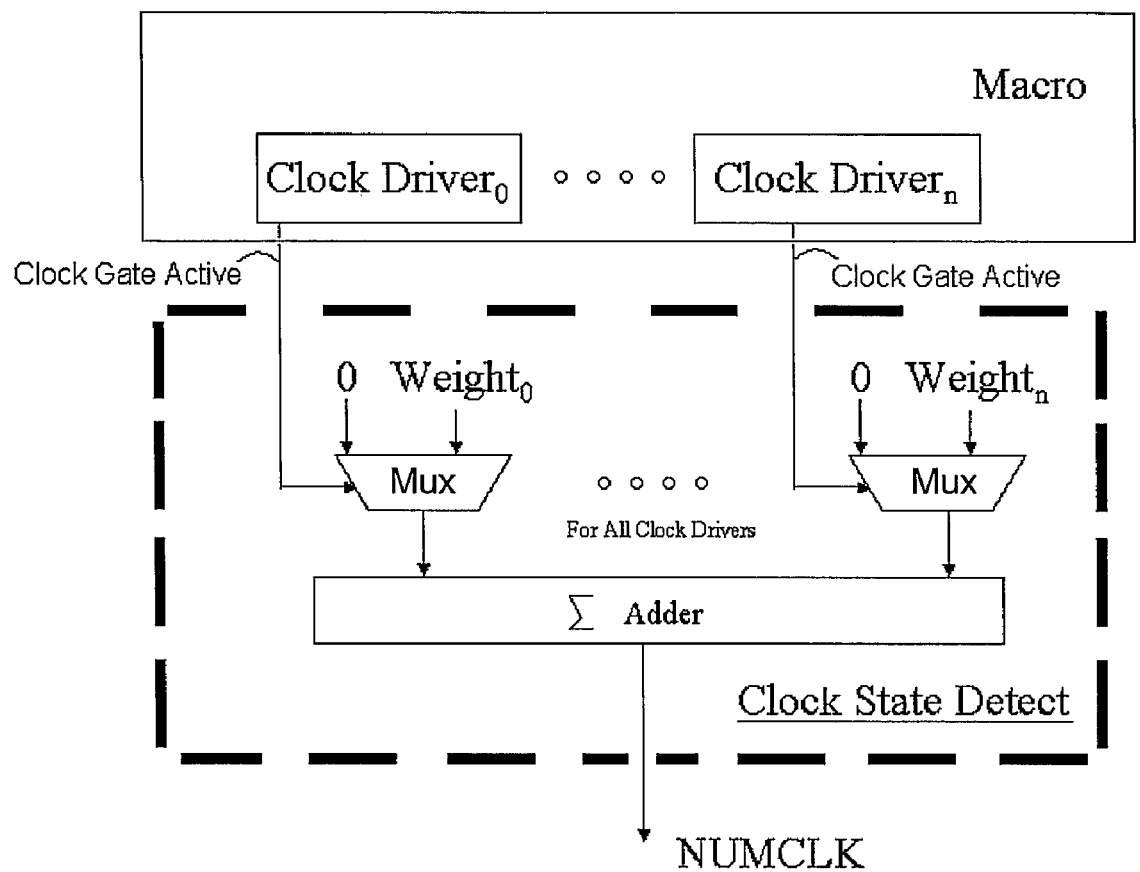
FIG. 6 is a block diagram of clock state detect logic of the representative macro power calculator block of FIG. 3.

FIG. 6 is a block diagram of Clock State Detect logic of FIG. 4. The Clock State Detect logic is customizable for each macro. As shown in FIG. 6, the macro includes RTL of clock drivers (namely, Clock Driver$_0$ through Clock Driver$_n$, where n+1 is a number of such clock drivers) in the integrated circuitry that is described by such macro. Further, as shown in FIG. 6, per clock cycle C (as indicated by logic states of the clock input Clk) of the integrated circuitry's simulated operation, the special purpose emulator hardware 116 (in response to its execution of the second software):

(a) per clock driver, as shown by such clock driver's respective multiplexer in FIG. 6, generates a value in response to whether a logic state of such clock driver's respective clock gate active line is 0 (which indicates that such clock driver is inactive in such clock cycle C) or 1 (which indicates that such clock driver is active in such clock cycle C); and (b) as shown by a fixed point adder in FIG. 6, adds such values from all of such multiplexers.

In such clock cycle C, the fixed point adder's resulting sum is NUMCLK for the macro, as shown in FIG. 6. For example, if the logic state of such clock driver's respective clock gate active line is 0 (which indicates that such clock driver is inactive in such clock cycle C), the special purpose emulator hardware 116 multiplexes a 0 value to the fixed point adder. Conversely, if the logic state of such clock driver's respective clock gate active line is 1 (which indicates that such clock driver is active in such clock cycle C), the special purpose emulator hardware 116 multiplexes such clock driver's respective Weight$_d$ value to the fixed point adder, where d is such clock driver's respective number, ranging from 0 through n (e.g., Weight$_0$ for Clock Driver$_0$). In that manner, the clock drivers in the integrated circuitry are weighted, so that the special purpose emulator hardware 116 selectively attributes different weights to one or more of such clock drivers, in order to more accurately model the respective effects of such clock drivers on the values of NUMCLK and TOTCLK. Per macro, the values of Weight$_0$ through Weight$_N$ are constant, as specified in the HDL that describes the operations and interconnection structures of the special purpose emulator hardware 116.

Figure 7:
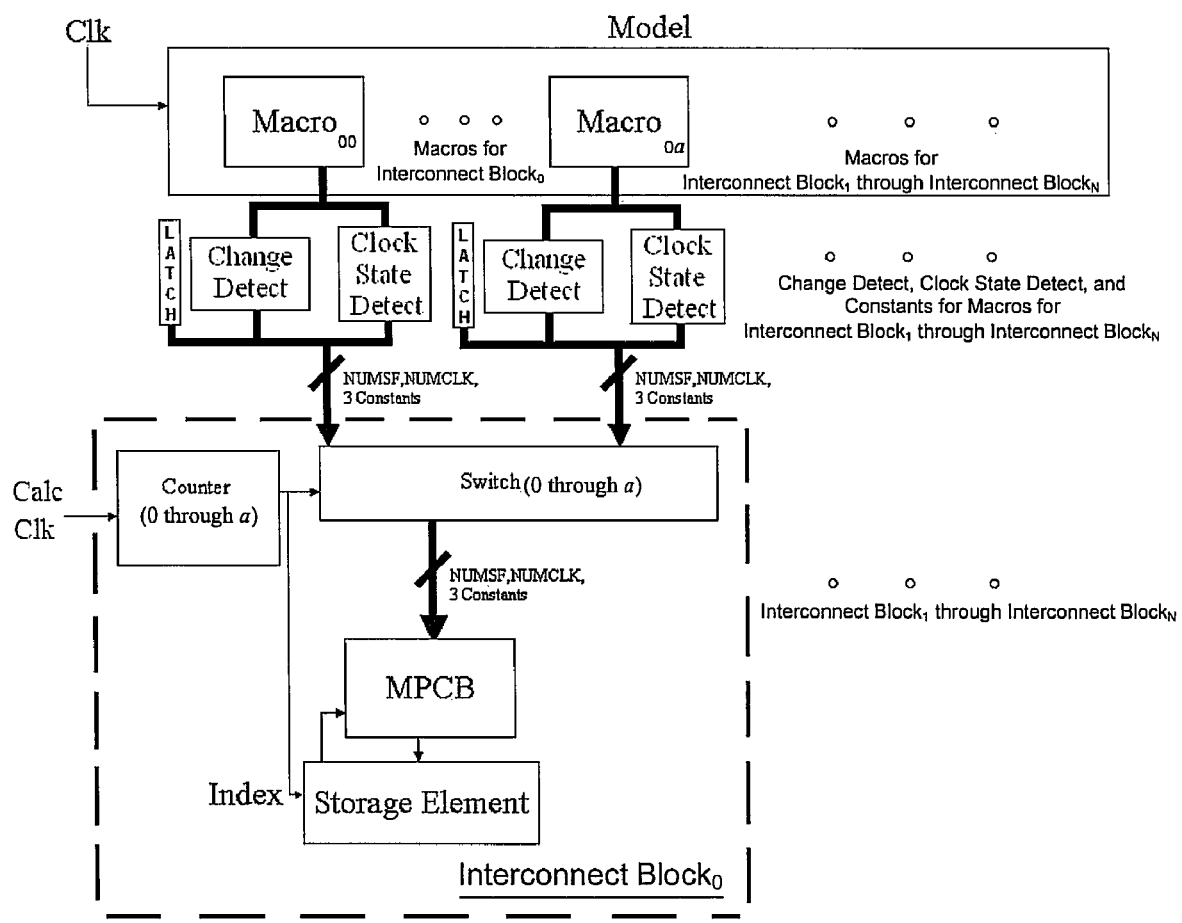
FIG. 7 is a block diagram of a representative interconnect block of the special purpose emulator hardware, according to the illustrative embodiment.

FIG. 7 is a block diagram of a representative interconnect block, namely Interconnect Block$_0$, of the special purpose emulator hardware 116. In the example of FIG. 7, the MPCB of the Interconnect Block$_0$ is dedicated to a subset of the numerous macros, instead of merely to a single macro; but otherwise, the MPCB of the Interconnect Block$_0$ is the same as the MPCB of FIG. 4. As shown in FIG. 7, the subset of the numerous macros (to which the MPCB of the Interconnect Block$_0$ is dedicated) includes a Macro$_{00}$ through a Macro$_{0a}$, where a+1 is a number of macros in the subset.

The special purpose emulator hardware 116 implements the interconnection structure of FIG. 7 if the numerous macros are so many that storage space in the special purpose emulator hardware 116 is insufficient to dedicate a respective MPCB per macro. As shown in FIG. 7, each macro is associated with: (a) a respective Change Detect logic for generating such macro's respective NUMSF; (b) a respective Clock State Detect logic for generating such macro's respective NUMCLK; and (c) a respective Latch for storing such macro's respective ConstA, ConstB and ConstC. In FIG. 7, a respective clock input Calc Clk (for the Interconnect Block$_0$) has a signal whose frequency is a+1 times greater than a frequency of Clk's signal. Accordingly, per clock cycle C (as indicated by logic states of the clock input Clk) of the integrated circuitry's simulated operation, Calc Clk (for the Interconnect Block$_0$) has a+1 cycles.

In a cycle 0 of Calc Clk within clock cycle C, a counter of the Interconnect Block0 has a value of 0, which specifies that the special purpose emulator hardware 116 (in response to its execution of the second software):

(a) as shown by a switch of the Interconnect Block$_0$, multiplexes: (i) the respective NUMSF of the Macro$_{00}$ to the MPCB of the Interconnect Block$_0$; (ii) the respective NUMCLK of the Macro$_{00}$ to the MPCB of the Interconnect Block$_0$; and (iii) the respective ConstA, ConstB and ConstC of the Macro$_{00}$ to the MPCB of the Interconnect Block$_0$; and (b) as shown by a Storage element of the Interconnect Block$_0$, multiplexes: (i) the respective stored total estimated power consumption for the Macro$_{00}$ to the MPCB of the Interconnect Block$_0$; and (ii) the second fixed point adder's resulting sum (discussed hereinabove in connection with FIG. 4) from the MPCB of the Interconnect Block$_0$, as an updated value of the Storage element's respective stored total estimated power consumption for the Macro$_{00}$, so that (in a next clock cycle C+1 of the integrated circuitry's simulated operation) such updated value is the then-current total estimated power consumption for the Macro$_{00}$, aggregately for all clock cycles of the integrated circuitry's simulated operation.

Similarly, in a cycle q of Calc Clk (where q is a macro's respective number, ranging from 0 through a within the Interconnect Block$_0$) within clock cycle C, a counter of the Interconnect Block$_0$ has a value of q, which specifies that the special purpose emulator hardware 116 (in response to its execution of the second software):

(a) as shown by a switch of the Interconnect Block$_0$, multiplexes: (i) the respective NUMSF of the Macro$_{0q}$ to the MPCB of the Interconnect Block$_0$; (ii) the respective NUMCLK of the Macro$_{0q}$ to the MPCB of the Interconnect Block$_0$; and (iii) the respective ConstA, ConstB and ConstC of the Macro$_{0q}$ to the MPCB of the Interconnect Block$_0$; and (b) as shown by a Storage element of the Interconnect Block$_0$, multiplexes: (i) the respective stored total estimated power consumption for the Macro$_{0q}$ to the MPCB of the Interconnect Block$_0$; and (ii) the second fixed point adder's resulting sum (discussed hereinabove in connection with FIG. 4) from the MPCB of the Interconnect Block$_0$, as an updated value of the Storage element's respective stored total estimated power consumption for the Macro$_{0q}$, so that (in a next clock cycle C+1 of the integrated circuitry's simulated operation) such updated value is the then-current total estimated power consumption for the Macro$_{0q}$, aggregately for all clock cycles of the integrated circuitry's simulated operation.

After a cycle a of Calc Clk (for the Interconnect Block$_0$) within clock cycle C, the counter operation repeats, starting with a cycle 0 of Calc Clk within a next clock cycle C+1.

As shown in the example of FIG. 7, the special purpose emulator hardware 116 implements additional interconnect blocks (namely, Interconnect Block$_1$ through Interconnect Block$_N$, where N+1 is a total number of interconnect blocks that are implemented by the special purpose emulator hardware 116). Interconnect Block$_0$ is a representative example of such interconnect blocks, but such interconnect blocks are respectively associated with potentially different numbers of macros (to which such interconnect blocks' MPCBs are respectively dedicated).

For example, even if the respective MPCB of the Interconnect $Block_1$ is dedicated to a+1 macros, the respective MPCB of the Interconnect $Block_1$ is dedicated to b+1 macros, where a and b are potentially different numbers. In such a situation: (a) a respective clock input Calc Clk (for the Interconnect $Block_1$) has a signal whose frequency is b+1 times greater than a frequency of Clk's signal; (b) accordingly, per clock cycle C (as indicated by logic states of the clock input Clk) of the integrated circuitry's simulated operation, Calc Clk (for the Interconnect $Block_1$) has b+1 cycles; and (c) after a cycle b of Calc Clk (for the Interconnect $Block_1$) within clock cycle C, the counter operation repeats, starting with a cycle 0 of Calc Clk within a next clock cycle C+1. The clock input Clk is distinguished from Calc Clk, in that the frequency and logic states of the clock input Clk are the same for all of the interconnect blocks in FIG. 7 (namely, Interconnect $Block_0$ through Interconnect $Block_N$).

In one example, the special purpose emulator hardware 116 was implemented as a single ET4×4 accelerator board with a VHDL description of approximately 5,000 MPCBs that were respectively dedicated to approximately 5,000 macros. If such a scale is maintained for the special purpose emulator hardware 116 to estimate power consumption of a microprocessor that is described by approximately 32,000 macros, the special purpose emulator hardware 116 would be implemented as: (a) seven ET4×4 accelerator boards, without the interconnection blocks of FIG. 7; or (b) six or fewer ET4×4 accelerator boards, with the interconnection blocks of FIG. 7. Also, if such a scale is maintained for the special purpose emulator hardware 116 to be implemented as a single ET4×4 accelerator board having a frequency of approximately 400 kHz: (a) a 16:1 macros-to-interconnection block ratio would result in a clock input Clk frequency of approximately 25 kHz, which would permit the Calc Clk frequency to be approximately 400 kHz, in accordance with such 16:1 ratio; and (b) within a number of seconds, the single ET4×4 accelerator board would be capable of estimating power consumption of a microprocessor that is described by approximately 32,000 macros.

Referring again to FIG. 1, the computer 104 and the computer-readable medium 114 are structurally and functionally interrelated with one another, as described further hereinbelow. In that regard, the computer-readable medium 114 is a representative one of the computer-readable media of the IHS 100 (including, but not limited to, the computer-readable medium 112). The computer-readable medium 114 stores (or encodes, or records, or embodies) functional descriptive material (including, but not limited to, software and data structures). Such functional descriptive material imparts functionality when encoded on the computer-readable medium 114. Also, such functional descriptive material is structurally and functionally interrelated to the computer-readable medium 114.

Within such functional descriptive material, data structures define structural and functional interrelationships between such data structures and the computer-readable medium 114 (and other aspects of the computer 104 and the IHS 100). Such interrelationships permit the data structures' functionality to be realized. Also, within such functional descriptive material, software (also referred to as computer programs or applications) defines structural and functional interrelationships between such software and the computer-readable medium 114 (and other aspects of the computer 104 and the IHS 100). Such interrelationships permit the software's functionality to be realized.

For example, the computer 104 reads (or accesses, or copies) such functional descriptive material from the computer-readable medium 114 into the memory device of the computer 104, and the computer 104 performs its operations (as described elsewhere herein) in response to such material, which is stored in the memory device of the computer 104. More particularly, the computer 104 performs the operation of processing software (which is stored, encoded, recorded or embodied on a computer-readable medium) for causing the computer 104 to perform additional operations (as described elsewhere herein). Accordingly, such functional descriptive material exhibits a functional interrelationship with the way in which the computer 104 executes its processes and performs its operations.

Further, the computer-readable media of the IHS 100 are apparatus from which the software is accessible by the computer 104, and the software is processable by the computer 104 for causing the computer 104 to perform such additional operations. In addition to reading such functional descriptive material from the computer-readable medium 114, the computer 104 is capable of reading such functional descriptive material from (or through) a network, which is also a computer-readable medium (or apparatus) of the IHS 100. Moreover, the memory device of the computer 104 is itself a computer-readable medium (or apparatus) of the IHS 100.

Figure 8:
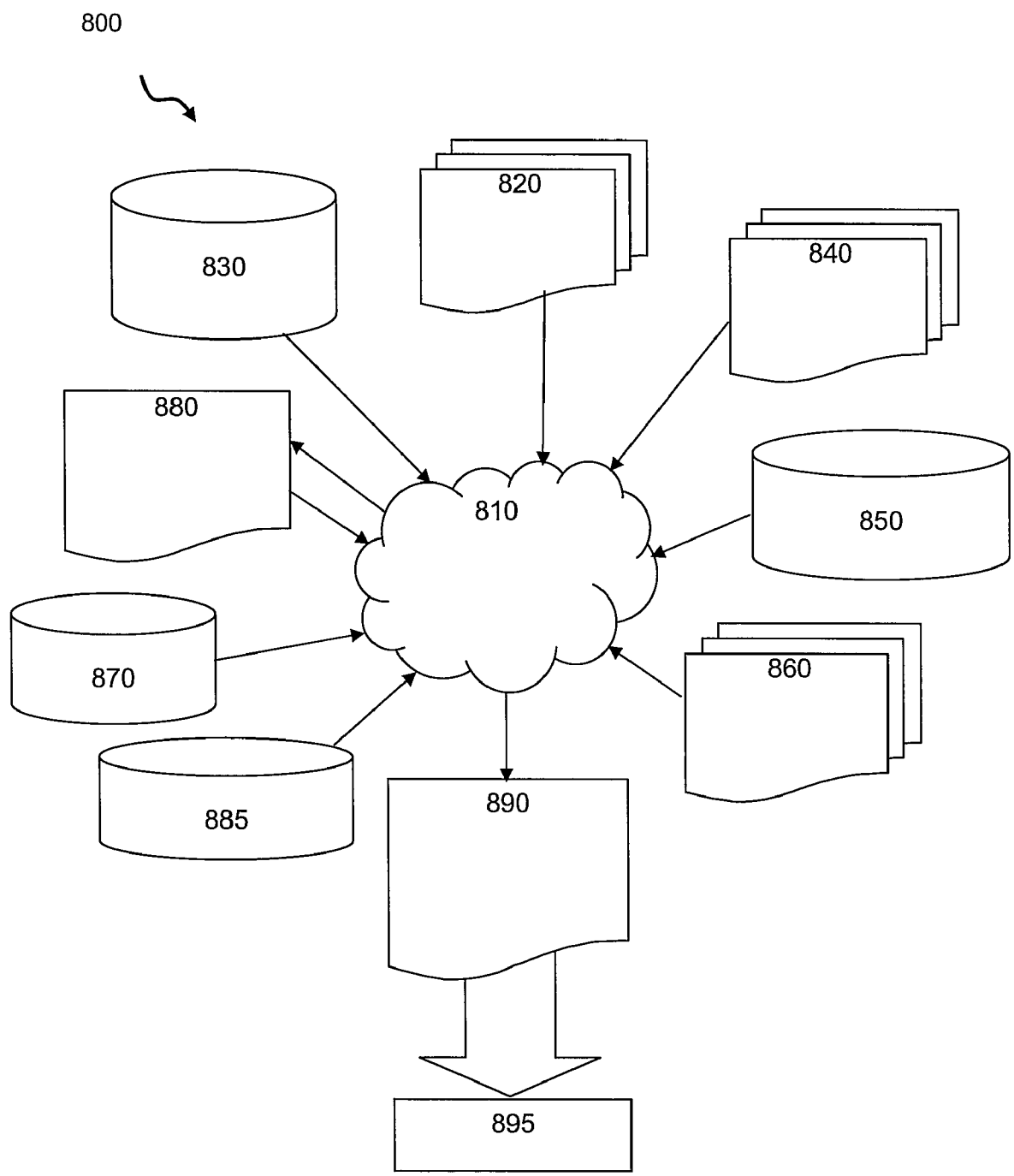
FIG. 8 is a flow diagram of a design process used in semiconductor design, manufacture and/or test.

FIG. 8 shows a block diagram of an exemplary design flow 800 used for example, in semiconductor IC logic design, simulation, test, layout, and manufacture. Design flow 800 includes processes and mechanisms for processing design structures to generate logically or otherwise functionally equivalent representations of the embodiments shown in FIGS. 4-7. The design structures processed and/or generated by design flow 800 are encodable on machine-readable transmission or storage media to include data and/or instructions that when executed or otherwise processed on a data processing system generate a logically, structurally, or otherwise functionally equivalent representation of hardware components, circuits, devices, or systems.

FIG. 8 illustrates multiple such design structures including an input design structure 820 that is preferably processed by a design process 810. In one embodiment, design structure 820 is a logical simulation design structure generated and processed by design process 810 to produce a logically equivalent functional representation of a hardware device. In another embodiment, design structure 820 also (or alternatively) includes data and/or program instructions that when processed by design process 810, generate a functional representation of the physical structure of a hardware device. Irrespective of whether representing functional and/or structural design features, design structure 820 is generable using electronic computer-aided design ("ECAD"), such as implemented by a core developer/designer. When encoded on a machine-readable data transmission or storage medium, design structure 820 is accessible and processable by one or more hardware and/or software modules within design process 810 to simulate or otherwise functionally represent an electronic component, circuit, electronic or logic module, apparatus, device, or system, such as those shown in FIGS. 4-7. Accordingly, in one example, design structure 820 includes files or other data structures, such as human and/or machine-readable source code, compiled structures, and computer-executable code structures, that when processed by a design or simulation data processing system, functionally simulate or otherwise represent circuits or other levels of hardware logic design. Examples of such data structures include hardware-description language ("HDL") design entities or other data structures conforming to and/or compatible with lower-level HDL design languages, such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 4-7 to generate a netlist 880, which may contain design structures such as design structure 820. In one example, netlist 880 includes compiled or otherwise processed data structures representing a list of wires, discrete components, logic gates, control circuits, I/O devices, models, and the like, which describes the connections to other elements and circuits in an integrated circuit design. Netlist 880 is synthesizable using an iterative process in which netlist 880 is resynthesized one or more times, depending on design specifications and parameters for the device. As with other design structure types described herein, netlist 880 is recordable on a machine-readable data storage medium. In one embodiment, the medium is a non-volatile storage medium, such as a magnetic or optical disk drive, a compact flash, or other flash memory. In another embodiment, the medium also (or alternatively) includes a system or cache memory, buffer space, or electrically or optically conductive devices and materials on which data packets are capable of being transmitted and intermediately stored via the Internet, or other networking suitable mechanism.

In one example, design process 810 includes hardware and software modules for processing a variety of input data structure types, including netlist 880. In one example, such data structure types reside within library elements 830 and include a set of commonly used elements, circuits, and devices, including models, layouts, and symbolic representations, for a given manufacturing technology (e.g., different technology nodes, 32 nm, 45 nm, 90 nm, and the like). In another example, the data structure types further include design specifications 840, characterization data 850, verification data 860, design rules 870, and test data files 885, which are suitable for including input test patterns, output test results, and other testing information. In another example, design process 810 further includes modules for performing standard circuit design processes such as timing analysis, verification, design rule checking, place and route operations, and the like.

Design process 810 employs and incorporates well-known logic and physical design tools, such as HDL compilers and simulation model build tools to process design structure 820, together with some or all of the depicted supporting data structures to generate a second design structure 890. Similar to design structure 820, design structure 890 preferably includes one or more files, data structures, or other computer-encoded data or instructions that reside on transmission or data storage media and that when processed by an ECAD system, generate a logically or otherwise functionally equivalent form of one or more of the embodiments shown in FIGS. 4-7. In one embodiment, design structure 890 includes a compiled, executable HDL simulation model that functionally simulates the devices shown in FIGS. 4-7.

In one example, design structure 890 employs a data format for the exchange of layout data of integrated circuits and/or symbolic data format (e.g. information stored in a GDSII ("GDS2"), GL1, OASIS, map files, or any other suitable format for storing such design data structures). In a further example, design structure 890 includes information, such as symbolic data, map files, test data files, design content files, manufacturing data, layout parameters, wires, levels of metal, vias, shapes, data for routing through the manufacturing line, and any other data processed by semiconductor manufacturing tools to fabricate embodiments as shown in FIGS. 4-7. Design structure 890 is then suitable for proceeding to a stage 895 where, for example, design structure 890: proceeds to tape-out, is released to manufacturing, is released to a mask house, is sent to another design house, is sent back to the customer, and the like.

Although illustrative embodiments have been shown and described, a wide range of modification, change and substitution is contemplated in the foregoing disclosure and, in some instances, some features of the embodiments may be employed without a corresponding use of other features. Accordingly, it is appropriate that the appended claims be construed broadly and in a manner consistent with the scope of the embodiments disclosed herein.

What is claimed is:

1. A design structure in a machine readable storage medium for designing, manufacturing, or testing integrated circuitry, the design structure comprising:
   first hardware for executing first software in response to a plurality of macros that describe the integrated circuitry, and for generating a set of constants in response to the execution of the first software; and
   second hardware, coupled to the first hardware, for receiving the set of constants from the first hardware, and for executing second software in response to the macros and the set of constants, and for estimating a power consumption of the integrated circuitry in response to the execution of the second software.

2. The design structure of claim 1, wherein the first hardware is for executing the first software with a general purpose computational resource.

3. The design structure of claim 1, wherein the second hardware is for executing the second software with a special purpose computational resource.

4. The design structure of claim 1, wherein the first software includes a simulation program with integrated circuit emphasis.

5. The design structure of claim 1, wherein the second hardware is for estimating the power consumption of the integrated circuitry in response to the execution of the second software, according to at least one of the following: interpolation in response to the set of constants; and extrapolation in response to the set of constants.

6. The design structure of claim 5, wherein the execution of the second software includes generating a measure of signals that toggle in a cycle of a simulated operation of the integrated circuitry, in response to the macros, and wherein the second hardware is for estimating the power consumption of the integrated circuitry in response to the execution of the second software, according to at least one of the following: interpolation in response to the set of constants and the measure of signals; and extrapolation in response to the set of constants and the measure of signals.

7. The design structure of claim 6, wherein the measure of signals is a weighted measure of signals, so that different weights are attributed to one or more of the signals.

8. The design structure of claim 5, wherein the execution of the second software includes generating a measure of clock drivers that are active in a cycle of a simulated operation of the integrated circuitry, in response to the macros, and wherein the second hardware is for estimating the power consumption of the integrated circuitry in response to the execution of the second software, according to at least one of the following: interpolation in response to the set of constants and the measure of clock drivers; and extrapolation in response to the set of constants and the measure of clock drivers.

9. The design structure of claim 8, wherein the measure of clock drivers is a weighted measure of clock drivers, so that different weights are attributed to one or more of the clock drivers.

10. The design structure of claim 1, wherein the second software and the macros are described together by a hardware description language for the execution by the second hardware.

11. The design structure of claim 1, wherein the design structure comprises a netlist.

12. The design structure of claim 1, wherein the design structure resides on a storage medium as a data format for exchange of layout data of the integrated circuitry.

13. A hardware description language ("HDL") design structure encoded on a machine-readable data storage medium, the HDL design structure comprising elements that when processed in a computer-aided design system, generate a machine-executable representation of integrated circuitry, wherein the HDL design structure comprises:
 a first element processed to generate a functional computer-simulated representation of first hardware for executing first software in response to a plurality of macros that describe the integrated circuitry, and for generating a set of constants in response to the execution of the first software; and
 a second element processed to generate a functional computer-simulated representation of second hardware, coupled to the first hardware, for receiving the set of constants from the first hardware, and for executing second software in response to the macros and the set of constants, and for estimating a power consumption of the integrated circuitry in response to the execution of the second software.

14. The HDL design structure of claim 13, wherein the first hardware is for executing the first software with a general purpose computational resource.

15. The HDL design structure of claim 13, wherein the second hardware is for executing the second software with a special purpose computational resource.

16. The HDL design structure of claim 13, wherein the first software includes a simulation program with integrated circuit emphasis.

17. The HDL design structure of claim 13, wherein the second hardware is for estimating the power consumption of the integrated circuitry in response to the execution of the second software, according to at least one of the following: interpolation in response to the set of constants; and extrapolation in response to the set of constants.

18. The HDL design structure of claim 17, wherein the execution of the second software includes generating a measure of signals that toggle in a cycle of a simulated operation of the integrated circuitry, in response to the macros, and wherein the second hardware is for estimating the power consumption of the integrated circuitry in response to the execution of the second software, according to at least one of the following: interpolation in response to the set of constants and the measure of signals; and extrapolation in response to the set of constants and the measure of signals.

19. The HDL design structure of claim 18, wherein the measure of signals is a weighted measure of signals, so that different weights are attributed to one or more of the signals.

20. The HDL design structure of claim 17, wherein the execution of the second software includes generating a measure of clock drivers that are active in a cycle of a simulated operation of the integrated circuitry, in response to the macros, and wherein the second hardware is for estimating the power consumption of the integrated circuitry in response to the execution of the second software, according to at least one of the following: interpolation in response to the set of constants and the measure of clock drivers; and extrapolation in response to the set of constants and the measure of clock drivers.

21. The HDL design structure of claim 20, wherein the measure of clock drivers is a weighted measure of clock drivers, so that different weights are attributed to one or more of the clock drivers.

22. The HDL design structure of claim 13, wherein the second software and the macros are described together by a hardware description language for the execution by the second hardware.

23. A method in a computer-aided design system for generating a functional design model of integrated circuitry, the method comprising:
 generating a functional computer-simulated representation of first hardware for executing first software in response to a plurality of macros that describe the integrated circuitry, and for generating a set of constants in response to the execution of the first software; and
 generating a functional computer-simulated representation of second hardware, coupled to the first hardware, for receiving the set of constants from the first hardware, and for executing second software in response to the macros and the set of constants, and for estimating a power consumption of the integrated circuitry in response to the execution of the second software.

24. The method of claim 23, wherein the first hardware is for executing the first software with a general purpose computational resource.

25. The method of claim 23, wherein the second hardware is for executing the second software with a special purpose computational resource.

26. The method of claim 23, wherein the first software includes a simulation program with integrated circuit emphasis.

27. The method of claim 23, wherein the second hardware is for estimating the power consumption of the integrated circuitry in response to the execution of the second software, according to at least one of the following: interpolation in response to the set of constants; and extrapolation in response to the set of constants.

28. The method of claim 27, wherein the execution of the second software includes generating a measure of signals that toggle in a cycle of a simulated operation of the integrated circuitry, in response to the macros, and wherein the second hardware is for estimating the power consumption of the integrated circuitry in response to the execution of the second software, according to at least one of the following: interpolation in response to the set of constants and the measure of signals; and extrapolation in response to the set of constants and the measure of signals.

29. The method of claim 28, wherein the measure of signals is a weighted measure of signals, so that different weights are attributed to one or more of the signals.

30. The method of claim 27, wherein the execution of the second software includes generating a measure of clock drivers that are active in a cycle of a simulated operation of the integrated circuitry, in response to the macros, and wherein the second hardware is for estimating the power consumption of the integrated circuitry in response to the execution of the second software, according to at least one of the following: interpolation in response to the set of constants and the measure of clock drivers; and extrapolation in response to the set of constants and the measure of clock drivers.

31. The method of claim 30, wherein the measure of clock drivers is a weighted measure of clock drivers, so that different weights are attributed to one or more of the clock drivers.

32. The method of claim 23, wherein the second software and the macros are described together by a hardware description language for the execution by the second hardware.

* * * * *